United States Patent
Rollin et al.

(10) Patent No.: US 6,201,403 B1
(45) Date of Patent: Mar. 13, 2001

(54) INTEGRATED CIRCUIT PACKAGE SHIELDING CHARACTERIZATION METHOD AND APPARATUS

(75) Inventors: Jacques J. Rollin, Magny-Ies-Hameaux (FR); Richard R. Goulette, Arnprior; William K.L. Wong, Kanata, both of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 08/935,049

(22) Filed: Sep. 22, 1997

(51) Int. Cl.[7] .................................................. G01R 31/26
(52) U.S. Cl. ........................ 324/765; 324/72; 324/158.1
(58) Field of Search ..................................... 324/765, 158, 324/72.5, 754

(56) References Cited

U.S. PATENT DOCUMENTS

| | | | |
|---|---|---|---|
| 4,939,446 | * | 7/1990 | Rogers ..................................... 324/72 |
| 5,006,792 | * | 4/1991 | Malhi et al. ........................... 324/158 |
| 5,053,700 | * | 10/1991 | Parrish .................................. 324/158 |
| 5,124,660 | * | 6/1992 | Clingiroglu ........................... 324/538 |
| 5,218,294 | * | 6/1993 | Soiferman .......................... 324/158.1 |

OTHER PUBLICATIONS

J.P. Muccioli et al, Integrated Circuit Radiated Emissions Diagnostic Procedure 1MHz to 1000MHz, Magnetic Field–Loop Probe, Jan. 31, 19995, pp. 1–23, Electromagnetic Compatibility Measurement Procedures for Integrated Circuits.

J.P. Muccioli et al, Integrated Circuit Radiated Emission Measurement Procedure 15 kHz ro 1000 MHz, TEM Cell, Jan. 31, 1995, pp. 1–13, Electromagnetic Compatibility Measurement Procedures for Integrated Circuits.

* cited by examiner

*Primary Examiner*—Josie Ballato
*Assistant Examiner*—Minh Tang

(57) ABSTRACT

A new method is introduced to characterize EMC at the IC/ASIC package level. It is designed to excite the modes of radiations found in IC/ASIC packages, and permits the characterization of packages in a way that represents their real application. In the new method, a small antenna designed on a die is mounted inside the package under test. The package is mounted on a carrier PCB that is used to feed a signal into the antenna on the die. Radiated emissions from this set-up are measured. The antenna on the die is measured in free space to obtain a reference level which represents its capability to radiate without shielding. The antenna is then measured inside a package to obtain its capability to radiate with package shielding. The difference between the two measurements will represent the shielding effectiveness or the EMI reduction the package offers to the die. All measurements may conveniently be performed inside a TEM (Transverse Electromagnetic Mode) cell. The antennas designed on the die will permit the measurement of shielding effectiveness, ground bounce and immunity properties of the packages.

29 Claims, 11 Drawing Sheets

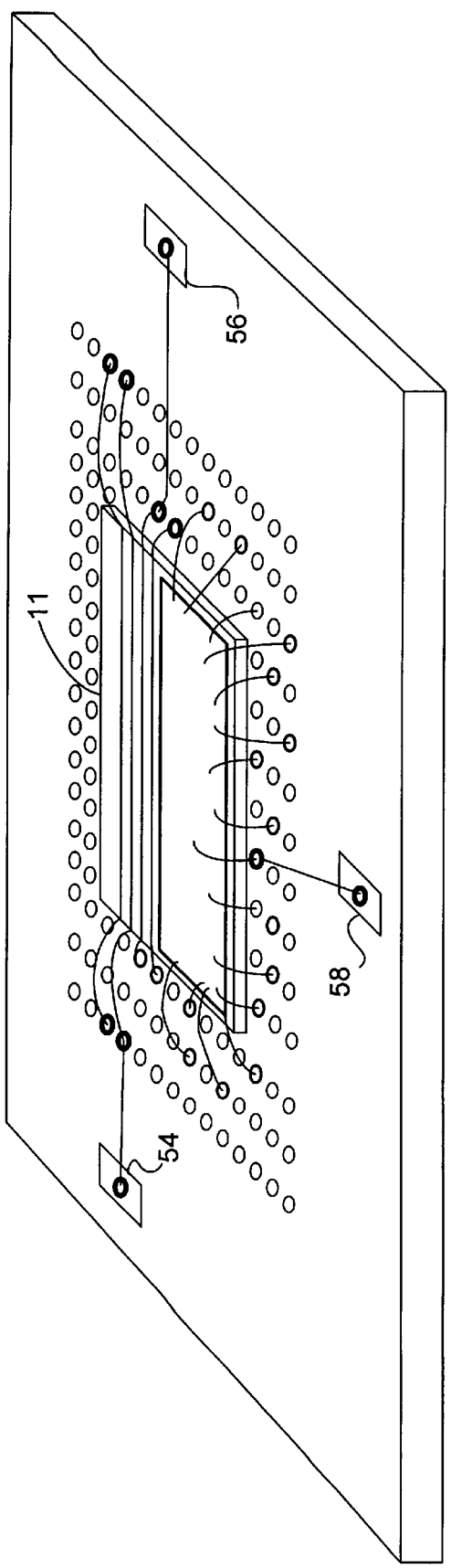

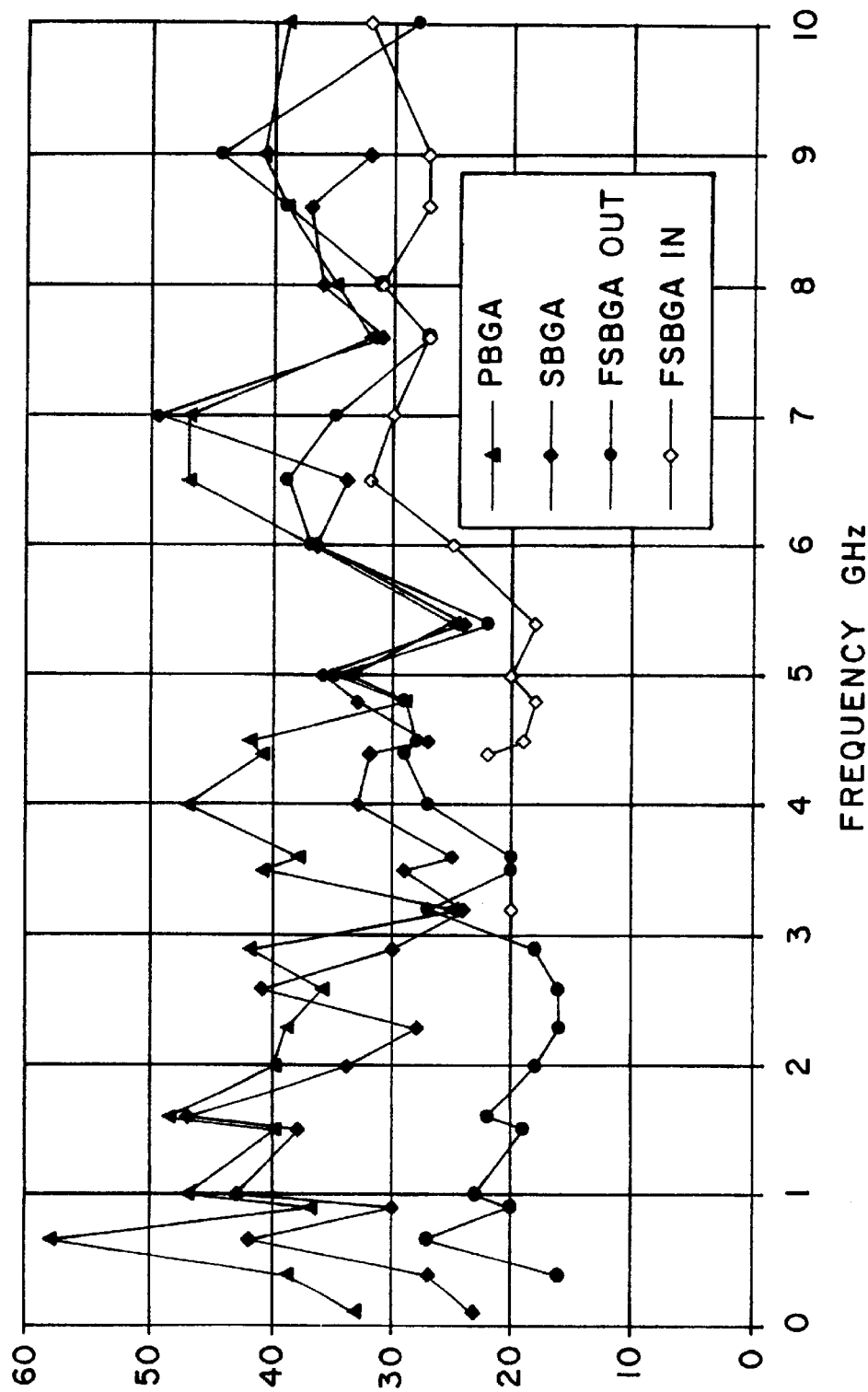
FIG. 5c PACKAGE TYPE

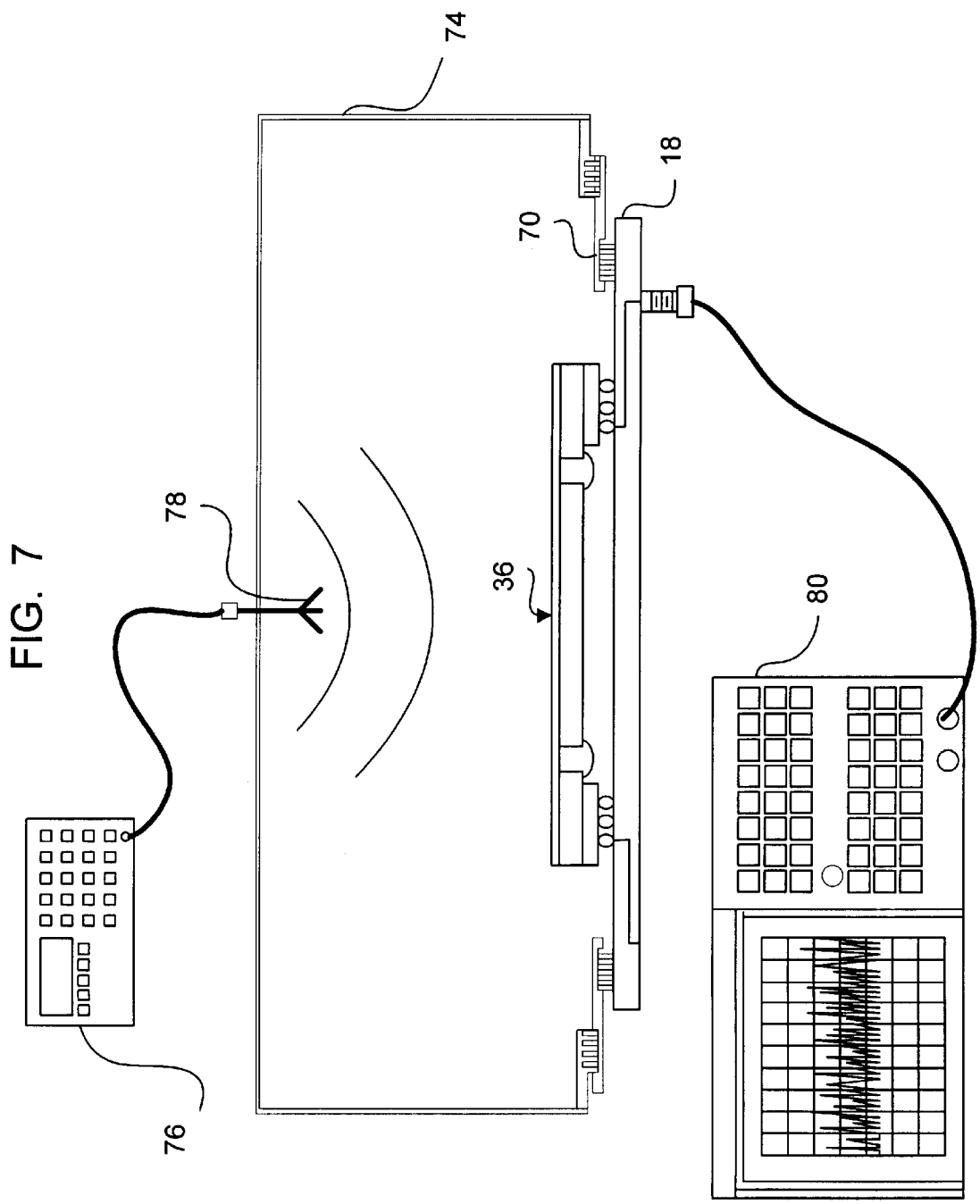

INTEGRATED CIRCUIT PACKAGE SHIELDING CHARACTERIZATION METHOD AND APPARATUS

FIELD OF THE INVENTION

The invention relates to a method and apparatus for testing integrated circuit packages for their effectiveness in shielding electromagnetic interference (EMI) emissions.

BACKGROUND OF THE INVENTION

EMI radiation from electronics mounted within a package or enclosure must be minimized in order to reduce or eliminate its potentially interfering effects on surrounding equipment such as communications receivers etc. Standards exist which stipulate the maximum EMI radiation which is permitted. These are referred to as EMC (electromagnetic compatibility) standards. Historically, the focus on reducing EMI radiation has been on enclosures or boxes which surround the electronic equipment mounted within the box. However, with new ICs (integrated circuits) and ASICs (application specific integrated circuits) being designed to operate at faster and faster speeds, individual chips are becoming significant contributors to the EMI problem and it has become important to design IC packages which are effective in reducing EMI, thereby reducing the burden of EMI reduction placed on the enclosures in which the IC packages are to be installed.

Existing methods for the EMC characterization of silicon devices were developed to measure radiation from printed circuit boards in operation inside electronic devices. These methods are not appropriate or capable of characterizing ASIC packages on their own without electronics. From a mechanical package point of view, various methods exist for measuring shielding effectiveness of metal enclosures for electronic equipment. However, these methods are not appropriate for small devices such as an ASIC package.

SUMMARY OF THE INVENTION

It is an object of the invention to obviate or mitigate one or more of the above identified disadvantages.

A new method is introduced to characterize EMI at the IC/ASIC package level. It is designed to excite the modes of radiation found in these packages in a way representative of the electronics which would normally exist inside them. In the new method, a small antenna designed on a test die is mounted inside the package under test. The package is mounted on a carrier PCB (printed circuit board) that is used to feed a test signal into the antenna on the die. Radiation is then measured from this set-up.

Preferably, the antenna is first measured in free space to obtain measurements which represent its capability to radiate without shielding. The antenna is then measured inside a package to obtain measurements representing its reduced capability to radiate with package shielding. The difference between the two measurements represents the shielding effectiveness or the EMI reduction the package offers to the die. Preferably, all measurements will be performed inside a wideband TEM (Transverse Electromagnetic Mode) cell.

According to a first broad aspect, the invention provides a method of characterizing the EMI (electromagnetic interference) emissions of a die package comprising the steps of: installing a test die in the package in place of where a normal die would be located, the test die having a first antenna thereon; injecting a test signal to the first antenna; measuring the EMI emissions produced by the first antenna at a point outside the package.

According to a second broad aspect, the invention provides a method of characterizing the EMI (electromagnetic interference) immunity of a die package comprising the steps of: installing a test die in the package in place of where a normal die would be located, the test die having a first antenna thereon; injecting a test signal to a second antenna located outside the package; measuring a resulting signal received by the first antenna.

According to a third broad aspect, the invention provides a test die for mounting within a package for performing EMI characterization of the package, the die comprising: a die with at least one antenna etched thereon; and connecting pads for connecting the antenna to connecting elements on the package.

According to a fourth broad aspect, the invention provides a test package for performing EMI characterization of a sample package, the test package comprising: a sample package with a test die installed in place of its normal die, the test die having at least one antenna etched thereon;

the test die having connecting pads connecting the antenna to connecting elements on the package.

BRIEF DESCRIPTION OF THE DRAWINGS

Preferred embodiments of the invention will now be described with reference to the attached drawings in which:

FIG. 4b is a perspective view of the carrier PCB of FIG. 4a with the test die of FIG. 2 mounted thereon;

FIG. 7 is a schematic illustration of an immunity characterization measurement test setup.

DETAILED DESCRIPTION OF THE PREFERRED EMBODIMENTS

A preferred embodiment of the invention will be described as it may be applied to testing the shielding effectiveness of various enhancements to a basic BGA (ball grid array) package, but of course it is to be understood that the invention may be used with many other packaging types.

For the purposes of this example, three different test EGA packages will be considered these being the basic plastic BGA, the SBGA (super ball grid array), and the FSBGA (Faraday super ball grid array).

Figure 1A:
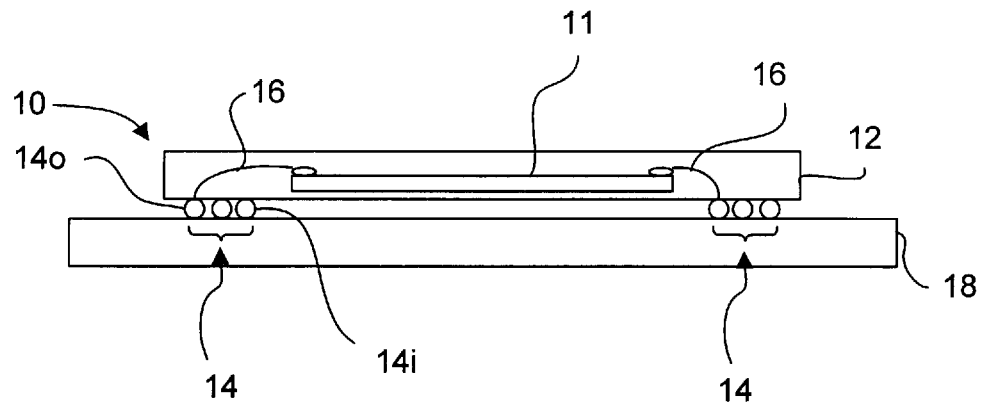
FIGS. 1a, 1b, 1c are side sectional views of a BGA (ball grid array) package, a SBGA (super ball grid array) package and a FSBGA (Faraday super ball grid array) package, respectively.

Referring to FIG. 1a, a basic plastic BGA package generally indicated by 10 has a test die 11 mounted within a plastic package 12. The package 12 has a set of connecting elements which consists of an array of balls 14 located on the bottom side of the plastic package 12. Although not evident from the sectional view of FIG. 1a, the array of balls consists of concentric rectangular rings of balls around the test die, and include an outer ring 14o and inner ring 14i. Connections 16 from various balls 14 to the test die 11 may be made. The package 10 is mounted to a package carrier such as a carrier PCB (printed circuit board) 18 which has a complementary footprint (not shown) by placing the array of balls 14 onto the footprint on the board 18. The regular plastic BGA package 12 has no emissions reductions features.

Figure 1B:
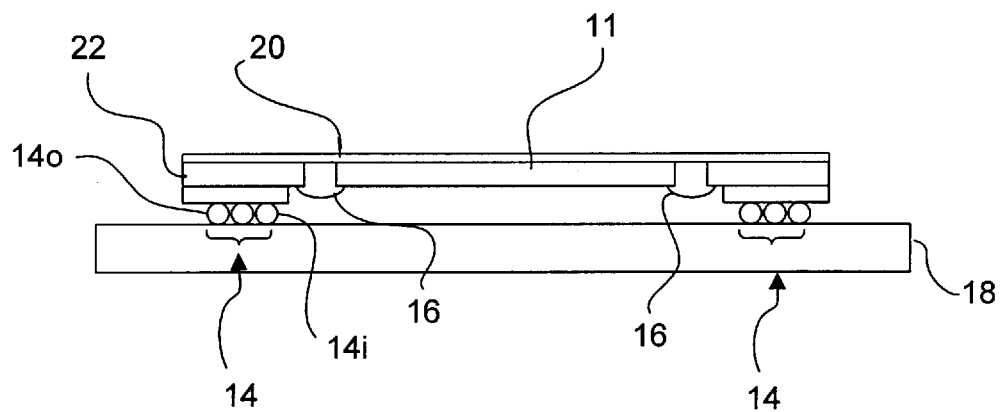

Referring now to FIG. 1b, an SBGA (super ball grid array) package is shown which is similar to the BGA package of FIG. 1a except that the test die 10 is mounted beneath a metal lid 20 rather than within a plastic package. A plastic layer 22 separates the metal lid 20 from the array of balls 14. The metal lid 20 in this case was introduced primarily to dissipate heat out of the die. It also provides a level of shielding effectiveness and should result in a decrease in measurable EMI when compared with the basic plastic BGA package of FIG. 1a, but there are still areas of the package through which EMI may leak.

Figure 1C:
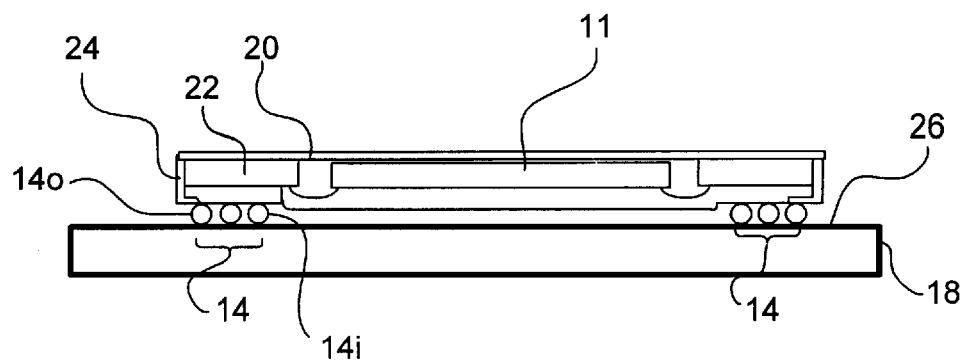

Referring now to FIG. 1c, a FSBGA (Faraday super ball grid array) package is shown which is similar to the SBGA package of FIG. 1b except that in this case the metal lid 20 is connected to the outer balls 14o of the array of balls 14 through a metallic multilayer interconnect 24. The package is shown mounted to a carrier PCB 18 which has a ground plane 26 connected with the outer balls 14o with the result that the lid 20 is grounded through the package to obtain a Faraday cage around the test die 11. This should result in a further level of improvement in EMI reductions when compared with the SBGA package of FIG. 1b.

Figure 2:
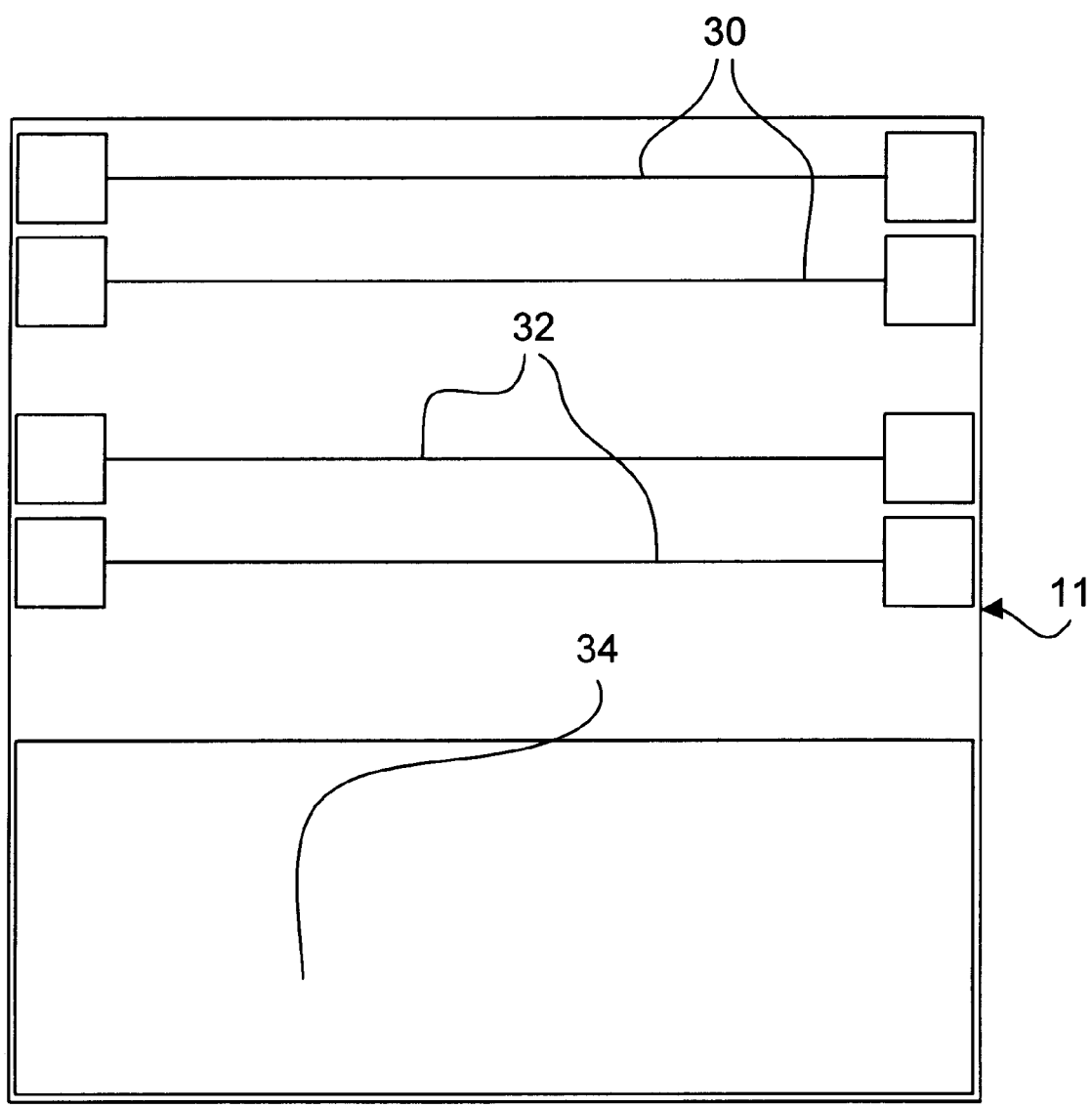
FIG. 2 is a plan view of a test die according to an aspect of the invention.

Referring now to FIG. 2, a test die according to an aspect of the invention is shown and is generally indicated by 11. The test die 11 has the same size as a normal die which would be mounted in the packages under test, in this example, the various BGA packages. There are three different antenna patterns 30, 32, 34 on the die. Two of the patterns 30, 32 each consist of a pair of straight lines across the die 11. The third pattern 34 consists of a plate area. To minimize cost and increase design flexibility, the die 11 may be fabricated on the fibreglass material used for PCBs using conventional print and etch techniques for PCBs. It is preferably finished with soft gold plating over nickel to permit wire bonding inside the package.

Figure 3:
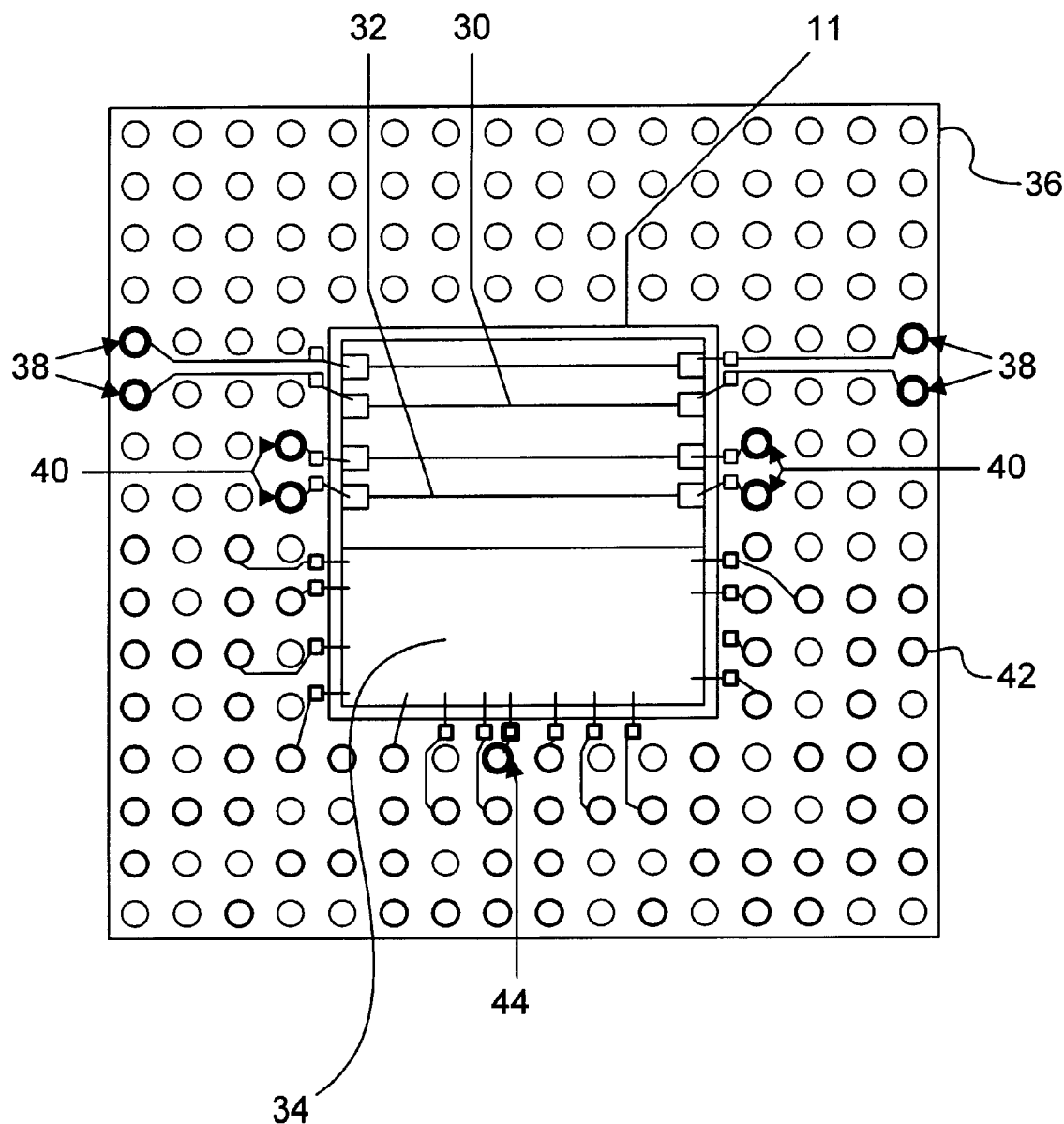
FIG. 3 is a bottom view of the die of FIG. 2 mounted inside an SBGA package.

In FIG. 3, the antenna die 11 of FIG. 2 is shown mounted inside a test SBGA package 36. The first pair of straight lines 30 are connected to two pairs of outside balls 38 in the outside row of balls 14o of the ball array 14, so as to permit the testing of EMI due to signals carried through the outside balls. The second pair of straight lines 32 are connected to two pairs of inside balls 40 in the inside row of balls 14i of the ball array 14, so as to permit the testing of EMI due to signals carried through the inside balls. Having separate connections to inside balls and outside balls will permit the measurement of the difference in radiation due to signals on the inside balls and the outside balls. These pairs of lines 30, 32 will form loop antennas with the rest of the package inter-connection and carrier PCB, as discussed further below.

The plate area 34 is designed to test noise distribution in ground balls (ground bounce) as well as some RF emission modes of the package. Each package has a number of ground balls 42 (shown in shaded grey) which are to be connected to ground. The plate area 34 consists of a plane of ground which is tied to the ground balls 42 of the package. As many ground balls 42 as possible should be bonded to this plate area 34. However, the quantity of balls used should be consistent with the actual quantity of ground balls in each of the packages being tested. One signal pin 44 is bonded to the middle of the plate 34 to permit the injection of a test signal into the ground plate 34. This will permit the measurement of the effectiveness of each package ground structure at returning current.

Figure 4A:
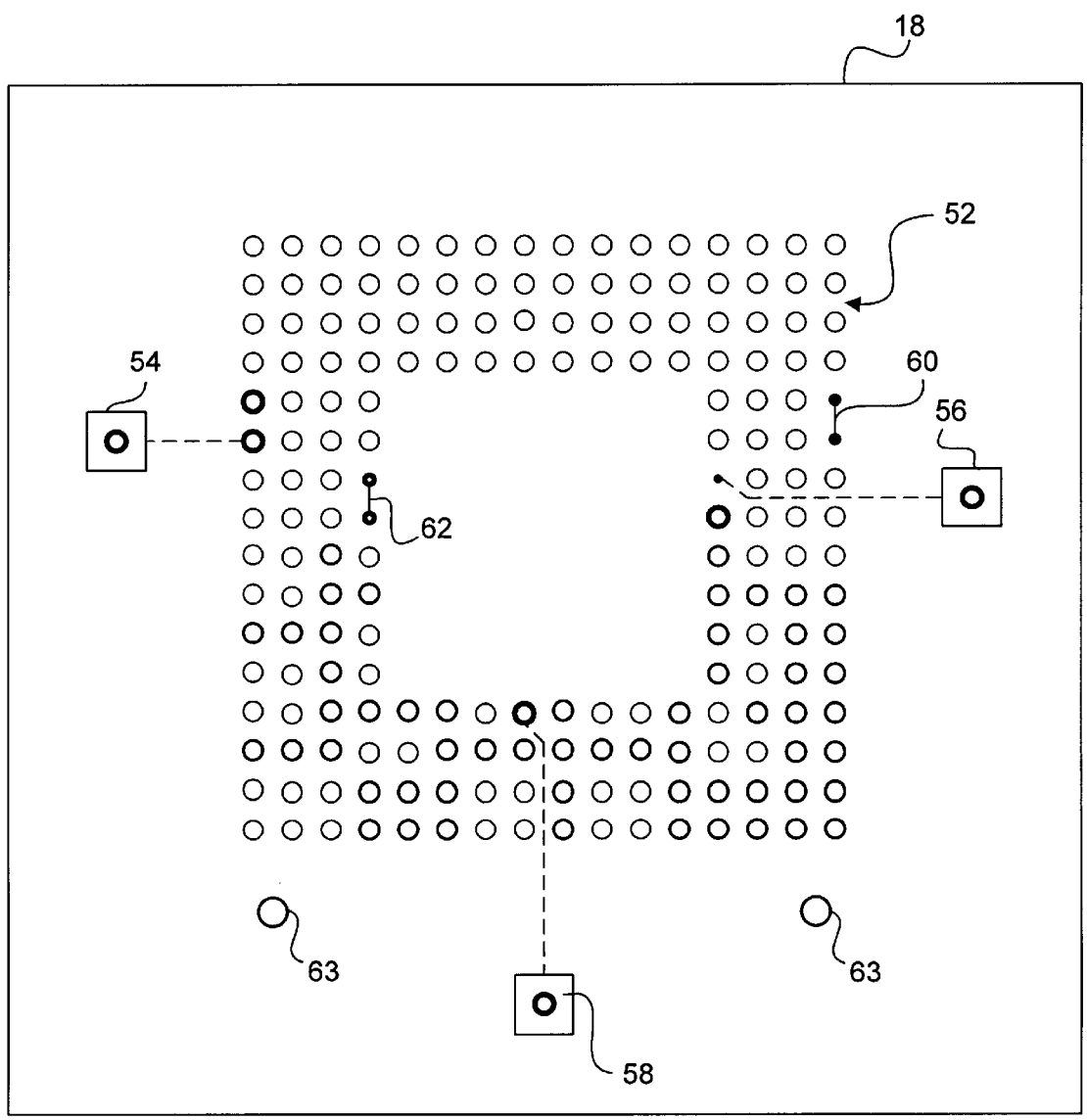
FIG. 4a is a top view of a carrier PCB (printed circuit board)

Referring now to FIG. 4a, a multilayer carrier PCB generally indicated by 18 with a BGA footprint 52 is shown which is designed to mount the three types of packages described previously. The carrier PCB 18 also has three terminals for injecting test signals into a BGA mounted to the carrier PCB. Referring now to FIGS. 3 and 4a, a first terminal 54 is for injecting a test signal into one of the outside balls 38 connected to the first pair of lines 30, a second terminal 56 is for injecting a test signal into one of the inside balls 40 connected to the second pair of lines 32, and a third terminal 58 is for injecting a test signal into the ball 44 connected to the plate area 34. The carrier PCB 18 also has connection traces 60, 62 between where two of the outside balls 38 and two of the inside balls 40 are to be connected. When a test die 11 is installed on the PCB 18, these traces 60, 62 make each pair of lines 30, 32 into a loop antenna, with one end of each loop connected to one of the terminals, and the other end of the loop connected to ground or a terminating resistor load. The carrier PCB has ground planes on its outside layers to shield the signal traces and prevent radiation. This will permit the measurement of emissions originating from the die and package structure, and not from the carrier PCB. The carrier PCB 18 also preferably has heat sink grounding straps 63 to test their effectiveness at reducing heat sink re-radiation. A perspective view of the PCB of FIG. 4a is shown in FIG. 4b with the test die 11 installed without its package for clarity.

Figure 5A:
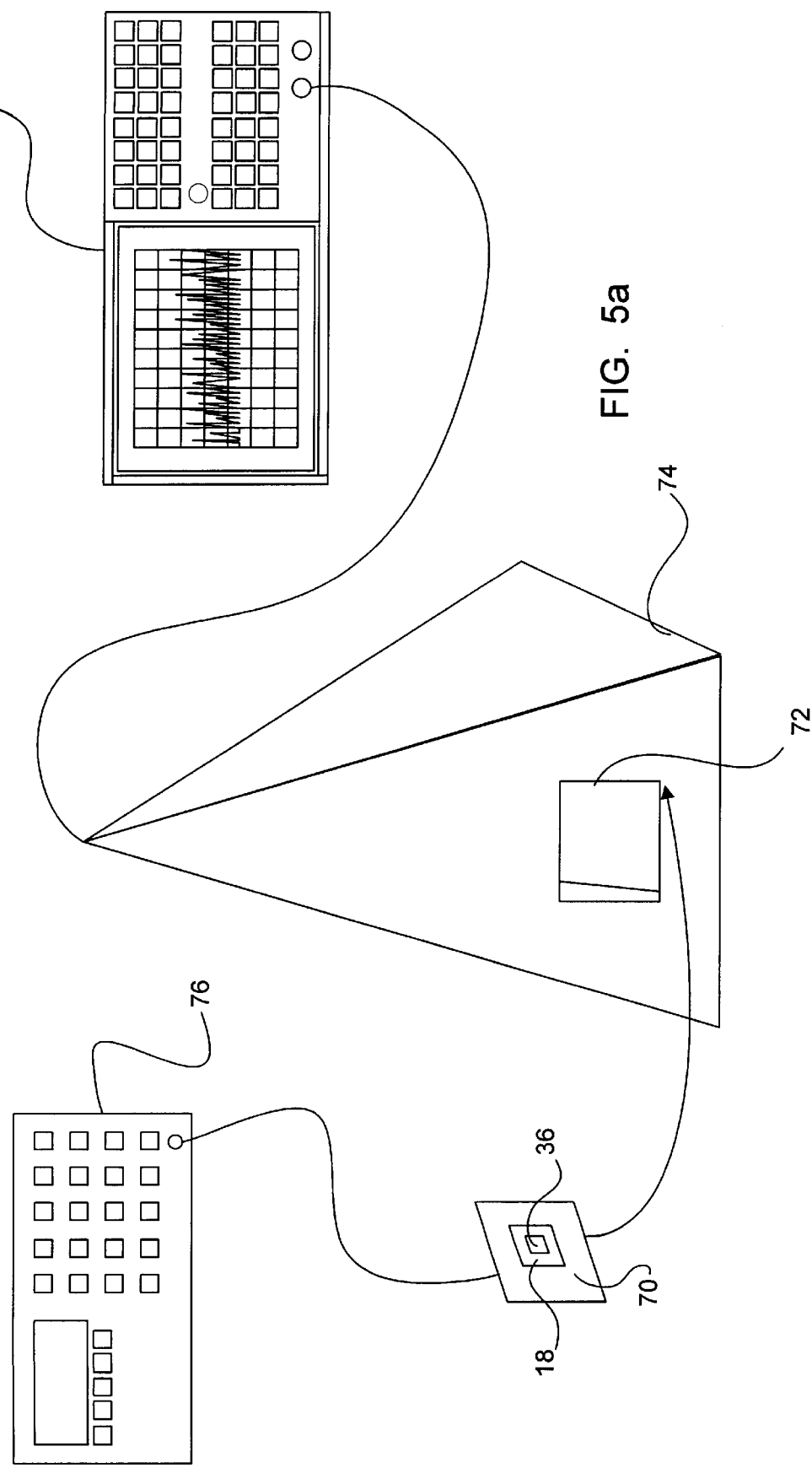
FIGS. 5a and 5b are schematic illustrations of a EMC shielding effectiveness measurement test setup.
Figure 5:
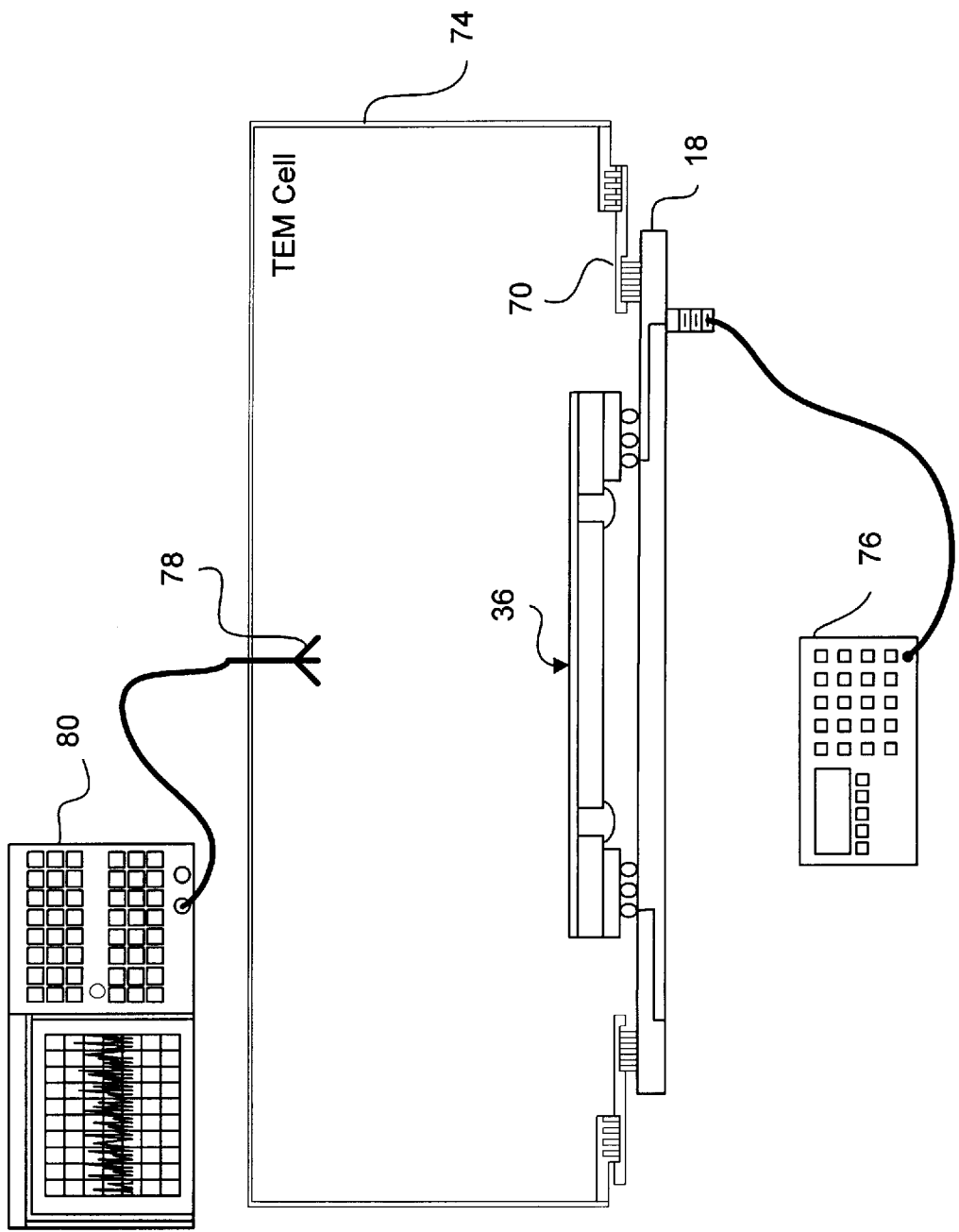
FIG. 5c is a graph containing test EMI readings for each of the packages of FIGS. 1a, 1b and 1c.

Referring now to FIGS. 5a and 5b, during test, the carrier PCB 18 with the package 36 under test will be mounted on a special bulkhead 70 that together with the PCB is installed over an opening 72 in a TEM (transverse electromagnetic mode) cell 74. Only the package 36 under test will be inside the TEM cell 74. This setup will permit the measurement of emissions from the package 36 only. Any leakage from any external equipment will be shielded out of the measurements.

A signal generator 76 is provided for injecting a signal into one of the terminals on the carrier PCB 18. An antenna 78 in the form of a septum or plate as is commonly used in TEM cell devices (see FIG. 5b) is mounted inside the TEM cell 74 and has a connection to an externally located spectrum analyzer 80.

Testing is performed for each of the various types of BGA packaging. The measurement may start with the plastic BGA, thereby providing a reference point. Measuring the BGA package not offering any shielding is equivalent to measuring the antenna in free space. Alternatively, a shielded package can be measured with its shielding lid removed.

The signal generator 76 will source a test signal into one of the antenna patterns (30, 32, or 34) on the die 11 through a SMA (subminiature series A) coax connector to one of the terminals (54, 56 or 58) on the carrier PCB 18. The spectrum analyzer 80 attached to the TEM antenna 78 will measure an output signal produced by the antenna 78 representing the emissions of the package resulting from the test signal.

Preferably, the signal generator will sweep the frequency range from 30 MHZ to 5 GHz with the test signal to characterize the package over the frequency range of interest. The test will be repeated for each antenna pattern with the same input signal. In each case the emissions detected by the antenna 78 in the TEM cell 74 will be measured over the same frequency range.

The test will be repeated on each type of package using the same test signal sweep. By comparing the spectrum analyzer output for the different package types, a determination of the effectiveness of each shielded BGA package compared to the basic BGA package can be made.

FIG. 5c is a graph containing sample plots of the EMI emissions of each of the three BGA package types. Two graphs are shown for the FSBGA package type, FSBGA OUT being the performance measured for outer balls, and FSBGA IN being the performance measured for inner balls. By preparing graphs such as this, testing personnel can determine the relative performance of each package type over the entire frequency range of interest. In the example of FIG. 5c, it is evident that the FSPGA package offers a substantial performance improvement particularly at frequencies below 3 GHz.

In the illustrated embodiment, in order to connect to the different antennas different connections to the die must be made. Alternatively a switching mechanism may be provided on the test die itself which allows an operator to switch between antennas on the die without requiring any change to the connections to the test die. This might be done with a manual switch, for example a screwdriver adjust through a non-radiating aperture. An electronic switch might alternatively be provided for switching between antennas.

In the illustrated embodiment, the noise is piped into the die from an external source. Alternatively, a noise source may be implemented on the test die itself. For example, a power transistor on the test die connected to an internal or external clock drive may be used to implement a noise source. For a design having an internal clock drive, the only connections required during testing would be to a power supply and to ground.

Figure 6A:
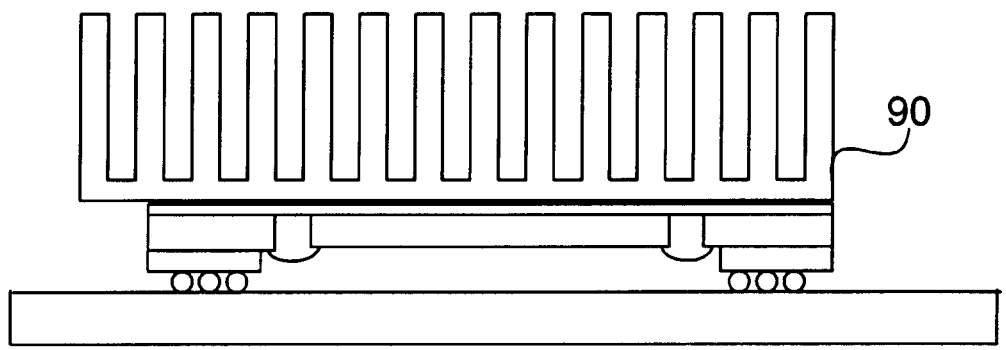
FIGS. 6a and 6b are side sectional views of two SBGA packages with each having a slightly different heat sink and mounted on a carrier PCB.
Figure 6B:
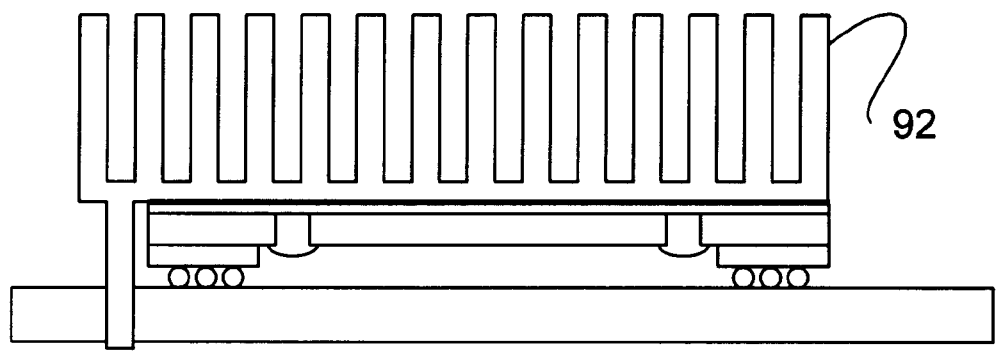

According to another aspect of the invention, methods are provided to determine the effect of a heat sink installed over a package from an EMC point of view. In the context of the above example, the testing procedures are repeated again with a heat sink attached to each of the basic plastic BGA, the SBGA and the FSBGA. The test may be performed with various grounding topologies for the heat sink, for example with one, two and four ground straps, and with different locations of the ground post, for example centre or corner. In FIG. 6a, an example SBGA test package is shown with an ungrounded heatsink 90 mounted on its surface, while in FIG. 6b the package has a grounded heatsink 92.

According to another aspect of the invention, methods are provided for characterizing packages for immunity from EMI. This will determine the effect of the packages on the IC/ASIC's immunity from external sources of EMI. The immunity characterization test method is similar to the shielding effectiveness test method except that the signals on the antennas are reversed. An example test setup for immunity characterization is shown in FIG. 7. In this case, an antenna on the die 11 is used as a receiving antenna and has its output connected to the spectrum analyzer 80. The TEM cell antenna 78 is used as the test signal injecting antenna, and has its input connected to the signal generator 76. The quantity of noise measured inside the ASIC package determines the immunity characteristics of the package. It may again be used to characterize package immunity over the frequency range 30 MHZ to 5 GHz, for example.

Numerous modifications and variations of the present invention are possible in light of the above teachings. It is therefore to be understood that within the scope of the appended claims, the invention may be practised otherwise than as specifically described herein.

Figure 8:
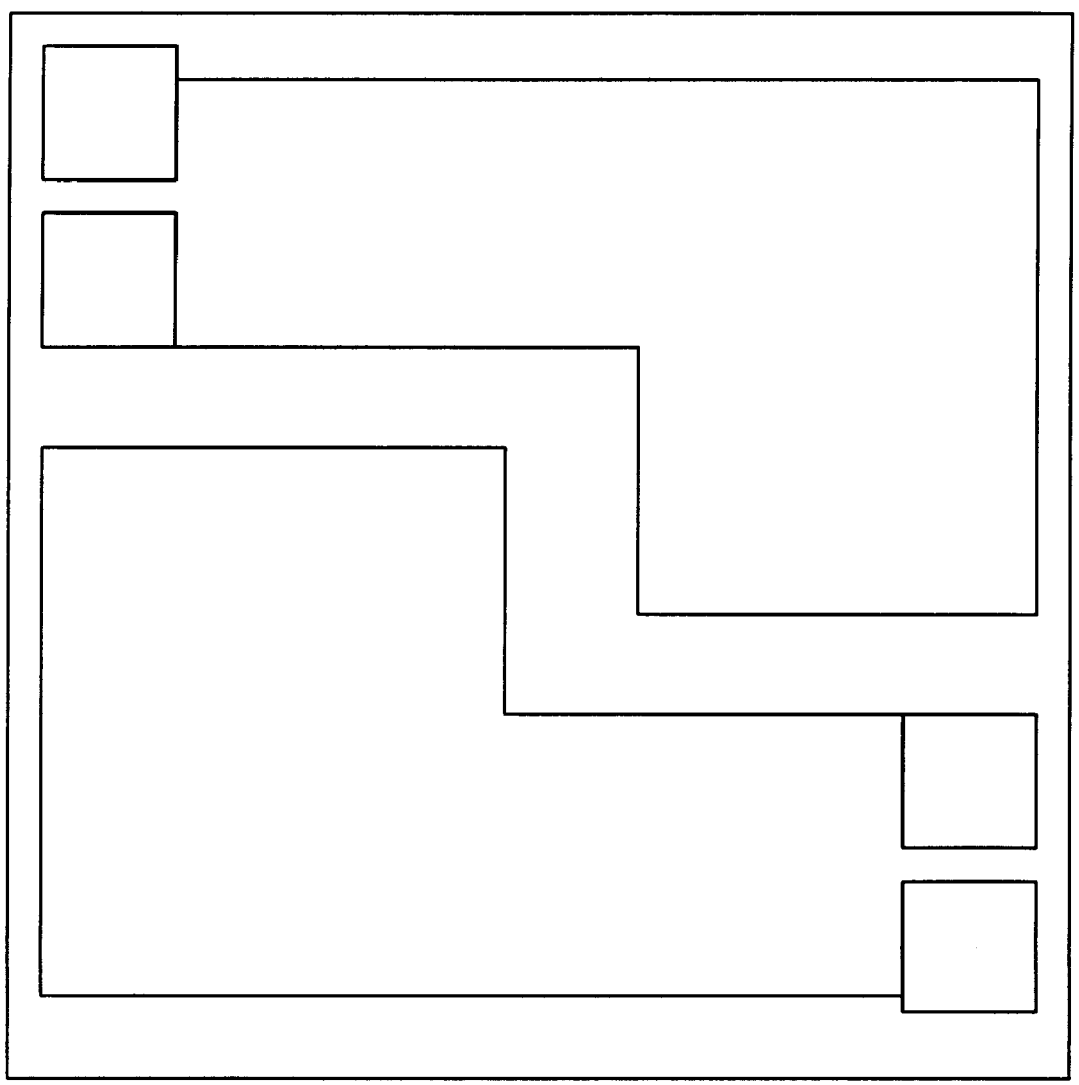
FIG. 8 is a top view of test die according to another aspect of the invention.

While a test die has been described which has a pair of lines and a ground plate area, other test die configurations are possible. For example, a configuration such as the one illustrated in FIG. 8 may be used in which two loop antennas are etched directly on the test die.

The guiding principle in these cases is that the antenna configuration is adjusted to imitate the flow pattern of high-frequency currents expected in the final integrated circuit device; this may be different for specific integrated circuit designs.

While the illustrated example has used connecting elements which are balls, other types of connecting elements may be used, such as pins for example.

In the illustrated example, signals are injected in single ended mode. However, differential signals could also be used to drive a pair of antenna lines for example. In this case, the differential signal would be applied across one end of the pair with the remaining end (both lines) being connected to ground.

The embodiments of the invention in which an exclusive property or privilege is claimed are defined as follows:

1. A method of characterizing the EMI (electromagnetic interference) emissions of a die package comprising the steps of:
    installing a test die in the package in place of where a normal die would be located, the test die having a first antenna thereon;
    injecting a test signal to the first antenna;
    measuring the EMI emissions produced by the first antenna at a point outside the package.

2. A method according to claim 1 further comprising placing the package inside a TEM (transverse electromagnetic mode) cell having a second antenna therein, wherein the measureing the EMI emissions is done with the second antenna.

3. A method according to claim 1 further comprising the steps of:
    mounting the package on a package carrier;
    mounting the package carrier over an opening in a TEM cell such that the package is entirely within the TEM cell;
    connecting a signal generator to inject the test signal to the first antenna;
    wherein said step of measuring the EMI emissions comprises measuring an output signal from a second antenna mounted within the TEM cell produced as a result of the test signal;
    wherein the output signal is representative of the EMI emissions produced by the first antenna within the package under test.

4. A method according to claim 1 wherein the test signal comprises a signal which is swept over a range of frequencies.

5. A method according to claim 1 wherein the first antenna comprises a pair of lines etched on the die.

6. A method according to claim 1 wherein the first antenna comprises a plate area etched on the die.

7. A method according to claim 1 wherein the package has a first set of connecting elements and a second set of connecting elements and wherein injecting a test signal to the first antenna is done sequentially for two first antennas, one of which is connected between the first set of connecting elements and one of which is connected between the second set of connecting elements.

8. A method of characterizing the EMI (electromagnetic interference) emissions of a die package comprising the steps of:
  installing a test die in the package in place of where a normal die would be located, the test die having a first antenna thereon;
  injecting a test signal to the first antenna;
  measuring the EMI emissions produced by the first antenna at a point outside the package;
  characterizing the EMI emissions of a package without any EMI shielding to obtain reference EMI measurements;
  characterizing the EMI emissions of one or more packages with EMI shielding to obtain sample EMI measurements; and
  comparing the sample EMI measurements with the reference EMI measurements to obtain a measure of the shielding effectiveness of the shielding on each package with EMI shielding.

9. A method according to claim 8 further comprising placing the package inside a TEM (transverse electromagnetic mode) cell having a second antenna therein, wherein the measuring the EMI emissions is done with the second antenna.

10. A method according to claim 8 further comprising the steps of:
  mounting the package on a package carrier;
  mounting the package carrier over an opening in a TEM cell such that the package is entirely within the TEM cell;
  connecting a signal generator to inject the test signal to the first antenna;
  wherein said step of measuring the EMI emissions comprises measuring an output signal from a second antenna mounted within the TEM cell produced as a result of the test signal;
  wherein the output signal is representative of the EMI emissions produced by the first antenna within the package under test.

11. A method according to claim 8 wherein the test signal comprises a signal which is swept over a range of frequencies.

12. A method according to claim 8 wherein the first antenna comprises a pair of lines etched on the die.

13. A method according to claim 8 wherein the fist antenna comprises a plate area etched on the die.

14. A method according to claim 8 wherein the package has a first set of connecting elements and a second set of connecting elements and wherein injecting a test signal to the first antenna is done sequentially for two first antennas one of which is connected between the first set of connecting elements and one of which is connected between the second set of connecting elements.

15. A method of characterizing the EMI (electromagnetic interference) emissions of a die package comprising the steps of:
  installing a test die in the package in place of where a normal die would be located, the test die having a first antenna thereon;
  injecting a test signal to the first antenna;
  measuring the EMI emissions produced by the first antenna at a point outside the package;
  wherein said steps of installing, injecting and measuring are conducted a first time to characterize the EMI emissions for a package without a heat sink to obtain reference measurements, and wherein said steps of installing, injecting and measuring are repeated to characterize the EMI emissions for one or more packages with heat sinks mounted thereon to obtain sample EMI measurements, the method further comprising:
    comparing the reference measurements with the sample measurements to obtain a measure of the shielding effectiveness of the each package with a heat sink.

16. A method of characterizing the EMI (electromagnetic interference) immunity of a die package comprising the steps of:
  installing a test die in the package in place of where a normal die would be located, the test die having a first antenna thereon;
  injecting a test signal to a second antenna located outside the package;
  measuring a resulting signal received by the first antenna.

17. A method according to claim 16 wherein the package is placed inside a TEM cell having the second antenna therein.

18. A method according to claim 16 further comprising the steps of:
  mounting the package on a package carrier;
  mounting the package carrier over an opening in a TEM cell such that the package is entirely within the TEM cell;
  connecting a signal generator to inject the test signal to the second antenna, the second antenna being mounted inside the TEM cell.

19. A method according to claim 16 wherein the test signal comprises a signal which is swept over a range of frequencies.

20. A method according to claim 16 wherein the first antenna comprises a pair of lines etched on the die.

21. A method according to claim 16 further comprising the steps of:
  characterizing the EMI immunity of a package without any EMI shielding to obtain reference EMI immunity measurements;
  characterizing the EMI immunity of one or more packages with EMI shielding to obtain sample EMI immunity measurements; and
  comparing the sample EMI immunity measurements with the reference EMI immunity measurements to obtain a measure of the shielding effectiveness of the shielding on each package with EMI shielding in terms of providing immunity from EMI.

22. A method according to claim 16 further comprising the steps of:
  characterizing the EMI immunity for a package without a heat sink to obtain reference immunity measurements;
  characterizing the EMI immunity for one or more packages with heat sinks mounted thereon to obtain sample EMI immunity measurements;
  comparing the reference immunity measurements with the sample immunity measurements to obtain a measure of the shielding effectiveness of the each package with a heat sink in terms of providing immunity from EMI.

23. A test package for performing EMI characterization of a sample package, the test package comprising:
- a sample package with a test die installed in place of its normal die, the test die having an antenna etched thereon;
- the test die having connecting pads connecting the antenna to connecting elements on the package.

24. A test package according to claim 23 comprising a plurality of said antennas etched thereon, each connected to connecting elements on the package.

25. A test package according to claim 24 wherein one of said antennas is a plate area connected to a plurality of connecting elements which are to be grounded, thereby facilitating the testing of ground bounce.

26. A test package according to claim 24 in combination with and mounted on a carrier PCB (printed circuit board).

27. A test package according to claim 26 wherein the PCB has connectors for injecting and or extracting test signals.

28. A test package according to claim 23 wherein the connecting elements are pins.

29. A test package according to claim 23 wherein the connecting elements are balls.

* * * * *

UNITED STATES PATENT AND TRADEMARK OFFICE
CERTIFICATE OF CORRECTION

PATENT NO. : 6,201,403 B1  
DATED : March 13, 2001  
INVENTOR(S) : Jacques J. Rollin et al.

Page 1 of 1

It is certified that error appears in the above-identified patent and that said Letters Patent is hereby corrected as shown below:

<u>Column 7, claim 13,</u>  
Line 53, change "fist" to -- first --

Signed and Sealed this

Second Day of April, 2002

Attest:

Attesting Officer

JAMES E. ROGAN  
*Director of the United States Patent and Trademark Office*